United States Patent
Lee et al.

(10) Patent No.: US 10,418,387 B2
(45) Date of Patent: Sep. 17, 2019

(54) THIN FILM TRANSISTOR ARRAY PANEL WITH INTERGRATED GATE DRIVER AND MANUFACTURING METHOD THEREOF

(71) Applicant: Samsung Display Co., Ltd., Yongin-si (KR)

(72) Inventors: Hyeon Jun Lee, Hwaseong-si (KR); Katsumi Abe, Ansan-si (KR); Young-Wook Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 84 days.

(21) Appl. No.: 15/416,373

(22) Filed: Jan. 26, 2017

(65) Prior Publication Data

US 2017/0141128 A1    May 18, 2017

Related U.S. Application Data

(63) Continuation of application No. 14/984,448, filed on Dec. 30, 2015, now Pat. No. 9,589,993.

(30) Foreign Application Priority Data

Mar. 24, 2015 (KR) .......................... 10-2015-0040853

(51) Int. Cl.
 *G09G 3/3266* (2016.01)
 *G09G 3/36* (2006.01)
 (Continued)

(52) U.S. Cl.
 CPC ......... *H01L 27/124* (2013.01); *G09G 3/3266* (2013.01); *G09G 3/3677* (2013.01);
 (Continued)

(58) Field of Classification Search
 CPC ... H01L 33/42; H01L 33/0041; H01L 27/124; H01L 27/1251; H01L 27/1255;
 (Continued)

(56) References Cited

U.S. PATENT DOCUMENTS

2005/0041002 A1* 2/2005 Takahara ............. G09G 3/3241
                                                           345/76
2008/0061422 A1   3/2008 Han et al.
(Continued)

FOREIGN PATENT DOCUMENTS

KR         10-1275710        6/2013
KR      10-2013-0083151      7/2013
(Continued)

OTHER PUBLICATIONS

Non-Final Office Action dated Jun. 29, 2016 in U.S. Appl. No. 14/984,448.
(Continued)

*Primary Examiner* — Allen L Parker
*Assistant Examiner* — Gustavo G Ramallo
(74) *Attorney, Agent, or Firm* — H.C. Park & Associates, PLC

(57) ABSTRACT

A thin film transistor array panel includes a substrate, a first gate electrode disposed on the substrate, a voltage wire disposed on the substrate, a gate insulating layer disposed on the first gate electrode and the voltage wire, a semiconductor pattern including an oxide semiconductor material disposed on the gate insulating layer, a source electrode and a drain electrode disposed at a distance from each other on the semiconductor pattern, a first passivation layer disposed on the source electrode and the drain electrode, and a first electrode disposed on the first passivation layer and connected with the voltage wire.

16 Claims, 12 Drawing Sheets

(51) Int. Cl.
*H01L 27/12* (2006.01)
*H01L 29/24* (2006.01)
*H01L 23/528* (2006.01)
*H01L 23/31* (2006.01)
*H01L 29/66* (2006.01)
*H01L 29/786* (2006.01)
*H01L 21/56* (2006.01)
*H01L 21/768* (2006.01)

(52) U.S. Cl.
CPC ......... *G09G 3/3688* (2013.01); *G09G 3/3696* (2013.01); *H01L 21/563* (2013.01); *H01L 21/76802* (2013.01); *H01L 21/76879* (2013.01); *H01L 23/3171* (2013.01); *H01L 23/528* (2013.01); *H01L 27/1225* (2013.01); *H01L 27/1244* (2013.01); *H01L 27/1248* (2013.01); *H01L 27/1255* (2013.01); *H01L 27/1259* (2013.01); *H01L 29/24* (2013.01); *H01L 29/66969* (2013.01); *H01L 29/7869* (2013.01); *G09G 2300/0426* (2013.01); *G09G 2310/0286* (2013.01); *G09G 2310/08* (2013.01); *G09G 2320/0214* (2013.01)

(58) Field of Classification Search
CPC ............ H01L 21/563; H01L 29/66969; G09G 3/3266; G09G 2310/0286
See application file for complete search history.

(56) References Cited

U.S. PATENT DOCUMENTS

| | | |
|---|---|---|
| 2010/0051910 A1 | 3/2010 | Choi |
| 2010/0110050 A1* | 5/2010 | Park .................... G09G 3/3266 345/205 |
| 2010/0277206 A1* | 11/2010 | Lee ..................... G09G 3/3677 327/108 |
| 2014/0042428 A1 | 2/2014 | Ning et al. |
| 2016/0180788 A1* | 6/2016 | Xiao ................... G09G 3/3677 345/204 |

FOREIGN PATENT DOCUMENTS

| | | |
|---|---|---|
| KR | 10-2014-0070996 | 6/2014 |
| KR | 10-2014-0096613 | 8/2014 |

OTHER PUBLICATIONS

Notice of Allowance dated Oct. 26, 2016 in U.S. Appl. No. 14/984,448.

* cited by examiner

THIN FILM TRANSISTOR ARRAY PANEL WITH INTERGRATED GATE DRIVER AND MANUFACTURING METHOD THEREOF

CROSS-REFERENCE TO RELATED APPLICATION

This application is a continuation of U.S. patent application Ser. No. 14/984,448, filed on Dec. 30, 2015, and claims priority from and the benefit of Korean Patent Application No. 10-2015-0040853, filed on Mar. 24, 2015, each of which is hereby incorporated by reference for all purposes as if fully set forth herein.

BACKGROUND

Field

Exemplary embodiments relate to a thin film transistor array panel and a method of manufacturing the thin film transistor array panel.

Discussion of the Background

The liquid crystal display (LCD), which is one of the most common types of flat panel displays currently in use, includes two sheets of array panels with field generating electrodes such as a pixel electrode, a common electrode, and the like. A liquid crystal layer is interposed between the two sheets of array panels. The liquid crystal display generates an electric field in the liquid crystal layer by applying a voltage to the field generating electrodes. The liquid crystal display determines the alignment of liquid crystal molecules of the liquid crystal layer through the generated electric field and controls the polarization of incident light, thereby displaying images.

Such a display device includes pixels, each being a unit for displaying an image, and drivers of different types. The drivers include a data driver applying a data voltage to the pixels and a gate driver applying a gate signal that controls transmission of the data voltage. Conventionally, the gate driver and the data driver are mounted as chips on a printed circuit board (PCB). Thus, the chip mounted gate driver and the data driver are directly mounted on the array panel. More recently, manufacturers have been developing gate drivers integrated on array panels (i.e., not formed as a separate chip) when the gate driver does not require high mobility of a channel of a thin film transistor. Manufacturer costs decrease as a result of integrating the gate driver as opposed to forming a separate gate driving chip because there are less manufacturing steps. An additional advantage is that the gate driver can be formed of a thin film transistor including an oxide semiconductor that uses a metal oxide having higher electron mobility than most materials.

The gate driver may include oxide semiconductor thin film transistors. A high voltage is applied between a source electrode and a drain electrode or between a gate electrode and a source electrode in a part of the oxide semiconductor thin film transistors. Accordingly, a high electric field that causes a hot carrier is formed, thereby causing the generation of charge trapping. In addition, the high electric field causes a current to leak through the thin film transistor.

The above information disclosed in this Background section is only for enhancement of understanding of the background of the inventive concept, and, therefore it may contain information that does not form the prior art that is already known in this country to a person of ordinary skill in the art.

SUMMARY

Exemplary embodiments provide a thin film transistor array panel that can prevent current leakage, and a manufacturing method thereof.

Exemplary embodiments also provide a thin film transistor array panel that can prevent deterioration of a thin film transistor, and a manufacturing method thereof.

Additional aspects will be set forth in the detailed description which follows, and, in part, will be apparent from the disclosure, or may be learned by practice of the inventive concept.

An exemplary embodiment discloses a thin film transistor array panel including a substrate, a first gate electrode disposed on the substrate, a voltage wire disposed on the substrate, a gate insulating layer disposed on the first gate electrode and the voltage wire, a semiconductor pattern including an oxide semiconductor material disposed on the gate insulating layer, a source electrode and a drain electrode disposed at a distance from each other on the semiconductor pattern, a first passivation layer disposed on the source electrode and the drain electrode, and a first electrode disposed on the first passivation layer and connected with the voltage wire.

An exemplary embodiment also discloses a method for manufacturing a thin film transistor array panel. The method includes disposing a first gate electrode and a voltage wire on a substrate, disposing a gate insulating layer on the first gate electrode and the voltage wire, disposing a semiconductor pattern comprising an oxide semiconductor material on the gate insulating layer, disposing a source electrode and a drain electrode at a distance from each other on the semiconductor pattern, disposing a first passivation layer on the source electrode and the drain electrode, and disposing a first electrode connected with the voltage wire on the first passivation layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description serve to explain the principles of the inventive concept.

DETAILED DESCRIPTION OF THE ILLUSTRATED EMBODIMENTS

Figure 1:
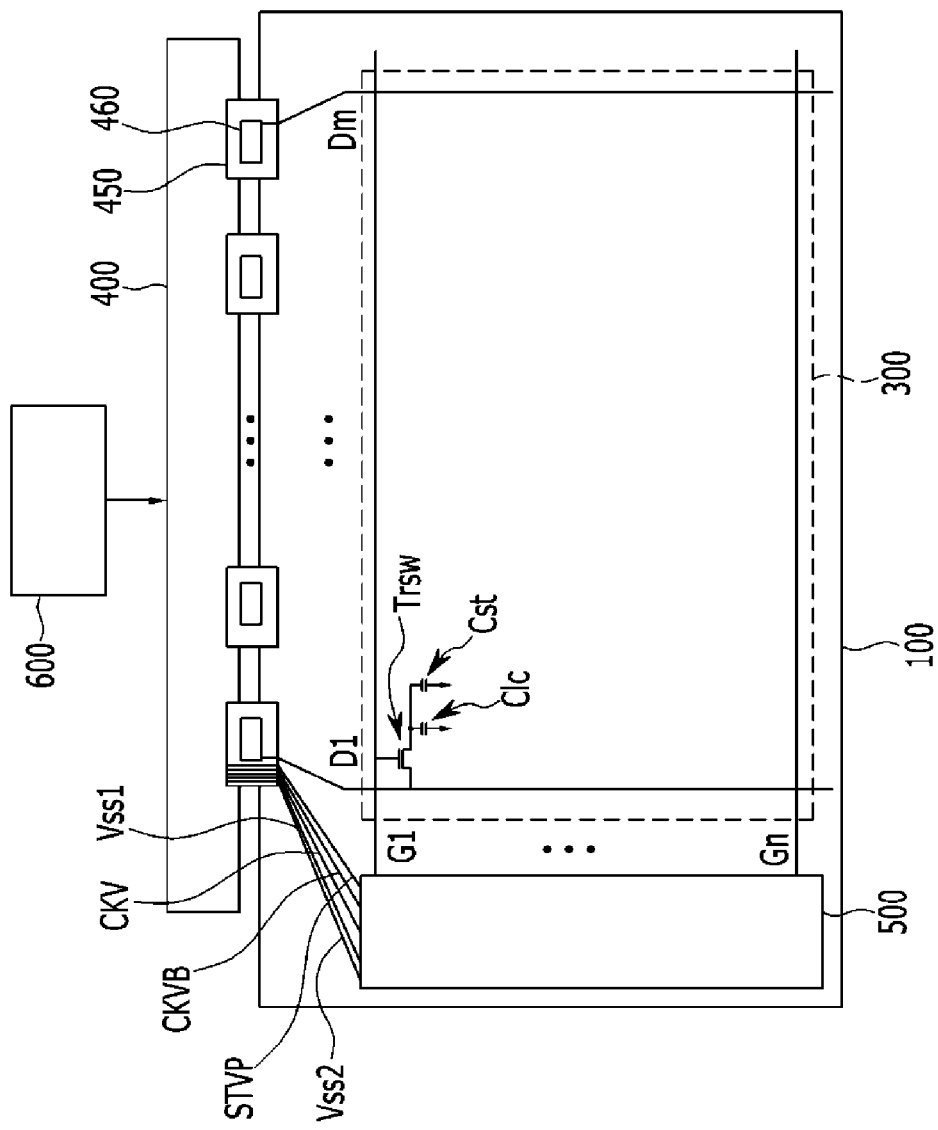
FIG. 1 is a top plan view of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A transistor forming a display device is exemplarily described as an N-type metal-oxide-semiconductor (NMOS) transistor.

FIG. 1 is a top plan view of a display device 100 according to an exemplary embodiment. Referring to FIG. 1, the display device 100 may include a display area 300 displaying an image and a gate driver 500 supplying a gate voltage to gate lines G1 to Gn of the display area 300.

The display device may include a data driver integrated circuit (IC) 460 supplying a data voltage to data lines D1 to Dm of the display area 300. The data driver IC 460 may be formed on a film such as a flexible printed circuit (FPC) film 450.

The data driver IC 460 and the gate driver 500 may be controlled by a signal controller 600. The flexible printed circuit film 450 may be electrically connected to a printed circuit board (PCB) 400. A signal from the signal controller 600 may be transmitted to the data driver IC 460 and the gate driver 500 through the printed circuit board 400 and the flexible printed circuit film 450.

The signal controller 600 may supply signals (i.e., clock signals CKV and CKVB and a scan start signal STVP) and predetermined-level low voltages Vss1 and Vss2 to the data driver IC 460, the gate driver 500, and the display area 300.

The display area 300 may include a pixels PX. When the display device 100 is a liquid crystal display, each pixel PX may include a thin film transistor Trsw, a liquid crystal capacitor Clc, and a storage capacitor Cst. A control end of the thin film transistor Trsw is connected to one gate line, an input end of the thin film transistor Trsw is connected to one data line, and an output end of the thin film transistor Trsw is connected to a first end of the liquid crystal capacitor Clc and a first end of the storage capacitor Cst.

A second end of the liquid crystal capacitor Clc may be connected to a common electrode (not shown), and a second end of the storage capacitor Cst may receive a storage voltage Vcst (not shown) applied from the signal controller 600. The structure of the pixel PX of the liquid crystal display may be realized with various exemplary embodiments. In FIG. 1, a pixel PX having a configuration beyond a basic structure of the illustrated pixel PX may also be applied.

FIG. 1 illustrates a liquid crystal display as the display device 100. However, the display device 100 may be an organic light emitting display device. As an organic light emitting display device, the pixel PX may include a thin film transistor and an organic light emitting diode. Another display device forms a display area 300 including an element such as a thin film transistor. Throughout this application, the display device will be described as a liquid crystal display for brevity. However, each exemplary embodiment may be implemented as an organic light emitting display device or any other suitable display device.

The display area 300 includes gate lines G1 to Gn and a data lines D1 to Dn. The gate lines G1 to Gn and the data lines D1 to Dn cross each other in an insulated manner.

The data driver IC 460 may be provided in an upper or lower side of the display device 100 and is connected to the data lines D1 to Dm extended in a substantially vertical direction. FIG. 1 illustrates an exemplary embodiment where the data driver IC 460 is provided in the upper side of the display device 100.

The gate driver 500 may receive the clock signals CKV and CKVB, the scan start signal STVP, a first low voltage Vss1 that corresponds to a gate-off voltage, and a second low voltage Vss2 that is lower than the gate-off voltage. The gate driver 500 may generate a gate voltage (gate-on voltage and gate-off voltage) and may apply the gate-on voltage sequentially to the gate lines G1 to Gn.

The clock signals CKV and CKVB, the scan start signal STVP, the first low voltage Vss1, and the second low voltage Vss2 may be applied to the gate driver 500 through the flexible printed circuit film 450 that is the closest to the gate driver 500 among the flexible printed circuit films 450 where the data driver ICs 460 are located, as shown in FIG. 1. The signals are transmitted to a film such as the flexible printed circuit film 450 through the printed circuit board 400 from an external source or the signal controller 600.

Figure 2:
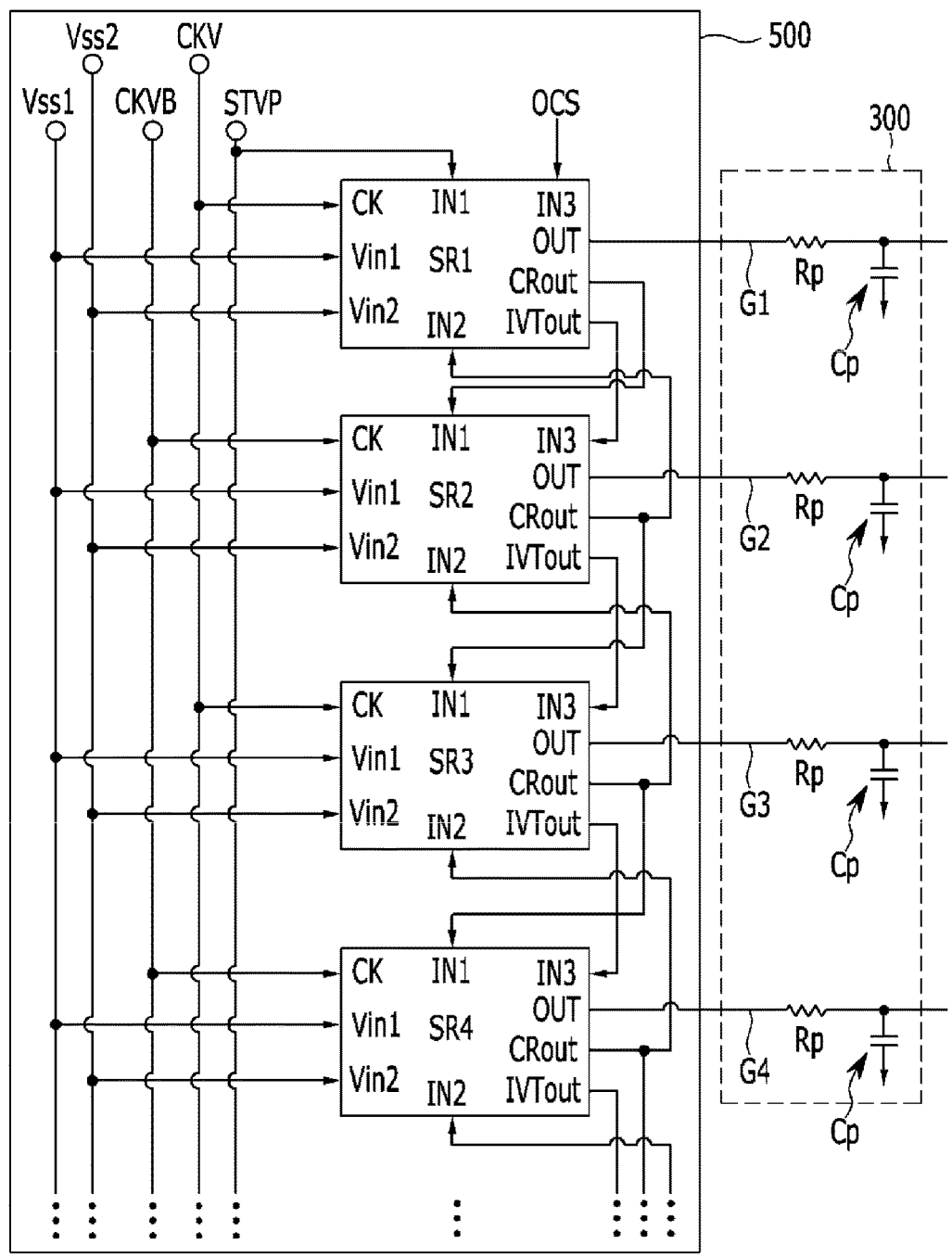
FIG. 2 is a detailed block diagram of a gate driver and a gate line in the exemplary embodiment of FIG. 1.

FIG. 2 is a detailed block diagram illustrating the gate driver 500 and gate lines G1 to Gn according to the exemplary embodiment.

In FIG. 2, the display area 300 is illustrated as parasitic resistance Rp and as parasitic capacitance Cp. This equivalently represents resistance Rp of the gate lines G1 to Gn and parasitic capacitance Cp being coupled to the gate lines G1 to Gn.

The gate driver 500 may include stages SR1, SR2, SR3, SR4, . . . , that may be dependently connected to each other. Each of the stages SR1, SR2, SR3, SR4, . . . , may include three input ends IN1, IN2, and IN3, one clock end CK, two voltage input ends Vin1 and Vin2, a gate voltage output end OUT outputting a gate voltage, a transmission signal output end CRout, and an inverter signal output end IVTout.

A first input end IN1 may be connected to a transmission signal output end CRout of the previous stage and may receive a transmission signal CR from the previous stage. For example, the second stage SR2 receives a transmission signal CR from the transmission signal output end CRout of the first stage SR1. Because the first stage SR1 does not have a previous stage, the first stage SR1 may receive the scan start signal STVP through the first input end IN1 of the first stage.

A second input end IN2 may be connected to a transmission signal output end CRout of the next stage and may receive a transmission signal CR from the next stage. For example, the first stage SR1 receives a transmission signal CR from the output end CRout of the second stage SR2.

A stage SRn−1 (not shown) connected to an (n−1)-th gate line Gn−1 and a stage SRn (not shown) connected to an n-th gate line Gn may form two dummy stages. The SRn−1 dummy stage may receive a transmission signal CR from the next stage and may a transmit transmission signal CR to the next stage. The SRn dummy stage may receive a transmission signal CR from the previous stage and transmit a transmission signal CR to the previous stage.

Unlike other stages, dummy stages SRn+1 and SRn+2 (not shown) may generate dummy gate voltages and may output the dummy gate voltages. More specifically, a gate voltage output from other stages SR1 to SRn may be transmitted through the gate line and a data voltage is applied to a pixel such that an image is displayed. However, the dummy stages SRn+1 and SRn+2 may not be connected to the gate lines. Even if the dummy stages SRn+1 and SRn+2 are connected with the gate lines, the gate lines may not be used in displaying of an image because they are connected with dummy pixels (not shown) that do not display an image.

A third input end IN3 may be connected to an inverter signal output end IVTout of the previous stage and may receive an inverter signal IVT of the previous stage. For example, the second stage SR2 receives the inverter signal IVT from the inverter signal output end IVTout from the first stage SR1. Because no previous stage exists prior to the first stage SR1, the first stage SR1 may additionally generate a corresponding signal or may control the dummy stages SRn+1 and SRn+2 (not shown) to generate signals that are appropriate in timing and then may receive the signals. In other words, when a gate-on voltage is applied in the corresponding stage, an output control signal OCS may be applied to the third input end IN3 of the first stage SR1. The output control signal OCS may have the same timing as the application of a lower voltage (Vss1 or Vss2).

A clock signal may be input to the clock input end CK of each stage SR1, SR2, SR3, and SR4. A first clock signal CKV may be applied to a clock input end CK of odd-numbered stages (i.e., the first stage SR1 and the third stage SR3) and a second clock signal CKVB may be applied to a clock input end CK of even-numbered stages (i.e., the second stage SR2 and the fourth stage SR4). The first clock signal CKV and the second clock signal CKVB may have opposite phases.

The first low voltage Vss1 that corresponds to the gate-off voltage may be applied to the first voltage input end Vin1 of each stage (i.e., stages SR1, SR2, SR3, and SR4). The second low voltage Vss2, having a lower voltages than the first low voltage Vss1, may be applied to the second voltage input end Vin2 of each stage. Voltage values of the first low voltage Vss1 and the second low voltage Vss2 may vary according to exemplary embodiments. As one example, the first low voltage Vss1 uses −6 V and the second low voltage Vss2 uses −10 V. In other words, the second low voltage Vss2 is lower than the first low voltage Vss1.

The operation of the gate driver 500 will be described.

A first stage SR1 may receive the first clock signal CKV through the clock input end CK. The first stage SR1 may also receive the scan start signal STVP through the first input end IN1. The first stage may also receive the first and second low voltages Vss1 and Vss2 through the first and second voltage input ends Vin1 and Vin2, respectively. Further, the first stage SR1 may receive a transmission signal CR supplied from a second stage SR2 through the second input end IN2 and may receive the output control signal OCS through the third input end IN3.

The first stage SR1 may output a gate-on voltage to the first gate line G1 through the gate voltage output end OUT according to the received signals CKV, STVP, Vss1, Vss2, CR, and OCS. In addition, the first stage SR1 may output the transmission signal CR from the transmission signal output end CRout and may transmit the transmission signal CR to the first input end IN1 of the second stage SR2. The first stage SR1 may also transmit the inverter signal IVT from the inverter signal output end IVTout to the third input end IN3 of the second stage SR2.

The second stage SR2 may receive the second clock signal CKVB through the clock input end CK. In addition, the second stage SR2 may receive the transmission signal CR of the first stage SR1 through the first input end IN1. The second stage SR2 may receive the first and second low voltages Vss1 and Vss2 through the first and second voltage input ends Vin1 and Vin2, respectively. The second stage SR2 may also receive the transmission signal CR supplied from the transmission signal output end CRout of the third stage SR3 through the second input end IN2. The second stage SR2 may further receives the inverter signal IVT supplied from the inverter signal output end IVTout of the first stage SR1 through the third input end IN3.

The second stage SR2 may output the gate-on voltage to the second gate line G2 through the gate voltage output end OUT according to the received signals CKVB, STVP, Vss1, Vss2, CR, and IVT. In addition, the second stage SR2 may output the transmission signal CR from the transmission signal output end CRout of the second stage SR2 and then transmits the transmission signal CR to the first input end IN1 of the third stage SR3 and the second input end IN2 of the first stage SR1. The second stage may output the inverter signal IVT from the inverter signal output end IVTout and then transmit the inverter signal IVT to the third input end IN3 of the third stage SR3.

The third stage SR3 may receive the first clock signal CKV supplied from an external source through the clock input end CK. The third stage SR3 may also receive the transmission signal CR from the transmission signal output end CRout of the second stage SR2 through the first input end IN1. The third stage SR3 may also receive the first and second low voltages Vss1 and Vss2 through the first and second voltage input ends Vin1 and Vi2, respectively. The third stage SR3 may receive the transmission signal CR supplied from the transmission signal output end CRout of the fourth stage SR4 through the second input end IN2. The third stage SR3 may receive the inverter signal IVT supplied from the inverter signal output end IVTout of the second stage SR2 through the third input end IN3.

The third stage SR3 may output the gate-on voltage to the third gate line G3 through the gate voltage output end OUT. The third stage SR3 may output the transmission signal CR through the transmission signal output end CRout and transmit the transmission signal CR to the first input end IN1 of the fourth stage SR4 and the second input end IN2 of the second stage SR2. Further, the third stage SR3 may transmit the inverter signal IVT through the inverter signal output end IVTout to the third input end IN3 of the fourth stage SR4.

The fourth stage SR4 is similar to the second stage SR2. Thus, for brevity, the fourth stage will not be described.

By using the above-stated method, the n-th stage may receive the second clock signal CKVB supplied from an external source through the clock input end CK. The n-th stage may receive the transmission signal CR of the (n−1)-th stage SR(n−1) through the first input end IN1. The n-th stage may receive the first and second low voltages Vss1 and Vss2 through the first and second voltage input ends Vin1 and Vin2, respectively. The n-th stage may receive the transmission signal CR supplied from the (n+1)-th stage SR(n+1) (i.e., a dummy stage) through the second end IN2. The n-th stage may receive the inverter signal IVT supplied from the (n−1)-th stage SR(n−1) through the third input end IN3. The n-th stage may output the gate-on voltage to the n-th gate line Gn through the gate voltage output end OUT. The n-th stage may output the transmission signal CR from the transmission signal output end CRout and transmit the transmission signal CR to the first input end IN1 of the (n+1)-th stage SR(n+1) (i.e., dummy stage) and the second input end IN2 of the (N−1)-th stage SR(n−1). The n-th stage may transmit the inverter signal IVT to the (n+1)-th stage SR(n+1) (i.e., dummy stage) from the inverter signal output end IVTout.

Figure 3:
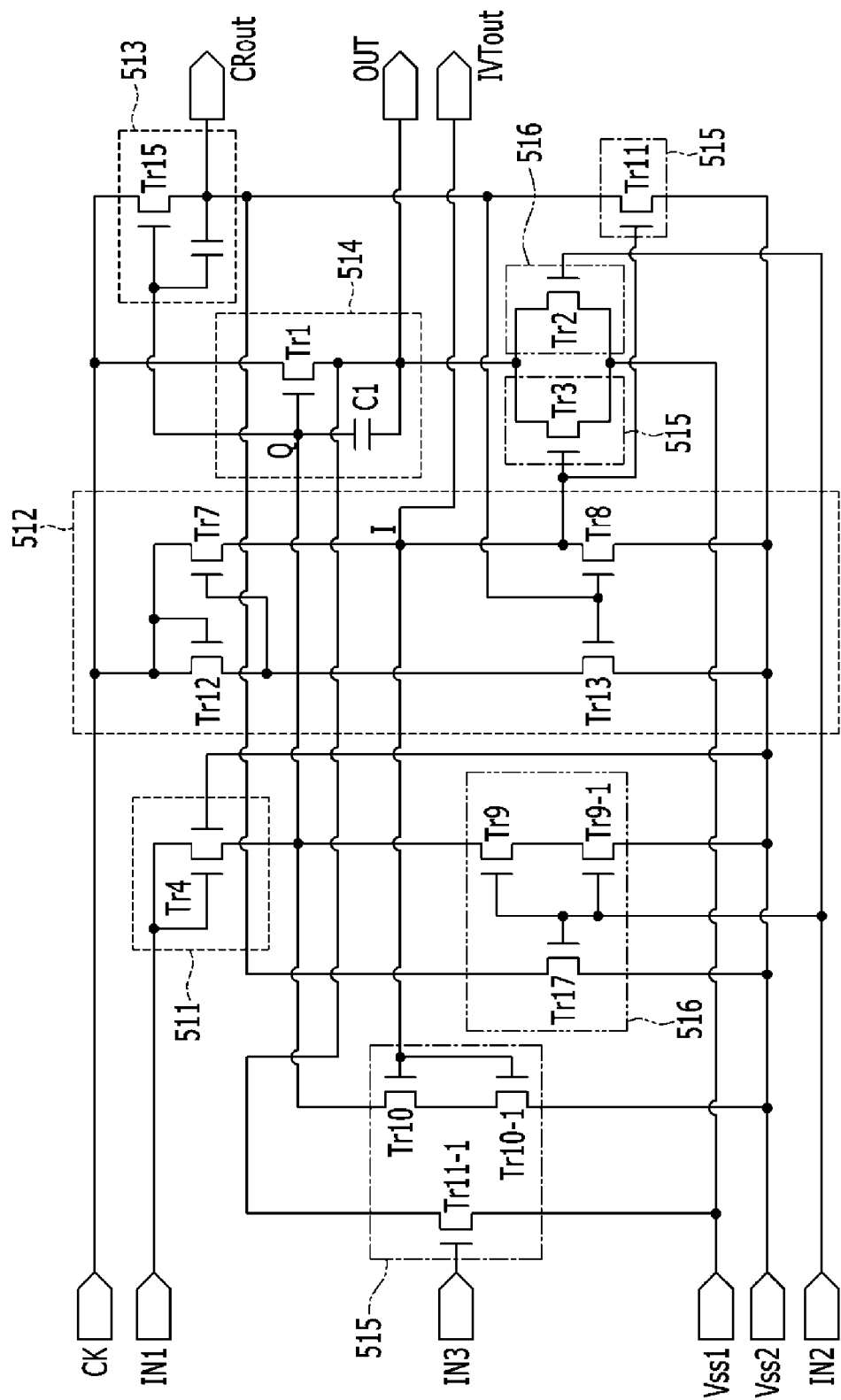
FIG. 3 is an enlarged circuit diagram of one stage in the gate driver according to the exemplary embodiment of FIG. 2.

FIG. 3 is an enlarged circuit diagram of one stage in the gate driver 500 according to the exemplary embodiment of FIG. 2.

Each stage SR of the gate driver 500 according to the present exemplary embodiment includes an input unit 511, an inverter 512, a transmission signal generator 513, an output unit 514, a noise remover 515, and a pull-down unit 516.

The input unit 511 may include one transistor (i.e., a fourth transistor Tr4). An input end and a first control end of the fourth transistor Tr4 may be diode-connected to the first input end IN1. A second control end of the fourth transistor Tr4 may be connected to the first voltage input end Vin1 or the second voltage input end Vin2. For example, FIG. 3 illustrates the second control end of the fourth transistor Tr4 is connected to the second voltage input end Vin2 supplying the second low voltage VSS2. An output end of the fourth transistor Tr4 may be connected to a node Q (hereinafter "a first node"). The fourth transistor Tr4 may include a thin film transistor having a double gate with the first control end including a bottom gate and the second control end including a top gate. When a high voltage is input to the first input end IN1, the input unit 511 serves to transmit the high voltage to the node Q.

The inverter 512 may include four transistors (i.e., a twelfth transistor Tr12, a seventh transistor Tr7, an eighth transistor Tr8, and a thirteenth transistor Tr13).

The twelfth transistor Tr12 may be diode-connected having a first end (i.e., an input end) connected to a control end of the twelfth transistor Tr12 and the clock input end CK. The twelfth transistor Tr12 may have a second end (i.e., an output end) that is connected with a control end of the seventh transistor Tr7 and an input end of the thirteenth transistor Tr13.

The control end of the seventh transistor Tr7 may be connected with the output end of the twelfth transistor Tr12. The seventh transistor Tr7 may have an input end that is connected with the clock input end CK and the control end of the twelfth transistor Tr12. The seventh transistor Tr7 may have an output end that is connected with a node I (also referred to as an inverter node or a second node).

A control end of the eighth transistor Tr8 may be connected with the transmission control signal output end CRout of the current stage. The eighth transistor Tr8 may have an input end that is connected with the node I. The eighth transistor Tr8 may have an output end that is connected with the second voltage input end Vin2 supplying the second low voltage VSS2.

An input end of the thirteenth transistor Tr13 may be connected with the output end of the twelfth transistor Tr12. The thirteenth transistor Tr13 may include a control end that is connected with the transmission signal output end CRout of the current stage and the control end of the eighth transistor Tr8. The thirteenth transistor Tr13 may include an output end that is connected with the second voltage input end Vin2 supplying the second low voltage VSS2.

When a high signal is applied as a clock signal, the high signal is transmitted to the input ends of the eighth and thirteenth transistors Tr8 and Tr13 by the twelfth and seventh transistors Tr12 and Tr7, respectively. Thus, the node I has a high voltage. The transmitted high signal lowers the voltage of the node I to the second low voltage VSS2 when the transmission signal CR is output from the transmission signal output end CRout of the current stage. As a result, the node I of the inverter 512 has a voltage level that is opposite to the transmission signal CR and the gate-on voltage of the current stage.

The transmission signal generator 513 may include one transistor (i.e., a fifteenth transistor Tr15). An input end of the fifteenth transistor Tr15 may be connected with the clock input end CK. Thus, the first clock signal CKV or the second clock signal CKVB may be applied to the transmission signal generator 513. The fifteenth transistor Tr15 may have a control end that is connected to an output of the input unit 511 (i.e., the node Q). The fifteenth transistor Tr15 may have an output end that is connected with the transmission signal output end CRout that outputs the transmission signal CR. Here, a parasitic capacitor (not shown) may be formed between the control end and the output end of the fifteenth transistor Tr15. An output end of the fifteenth transistor Tr15 may be connected not only with the transmission signal output end CRout but also with the noise remover 515 and the pull-down unit 516 and thus receives the second low voltage VSS2. As a result, when the transmission signal CR is low, a voltage value has the second low voltage VSS2.

The output unit 514 may include one transistor (i.e., a first transistor Tr1, and one capacitor (i.e., a first capacitor C1). A control end of the first transistor Tr1 may be connected to the node Q. The first transistor Tr1 may include an input end that receives the first clock signal CKV or the second clock signal CKVB through the clock input end CK. The first capacitor C1 may be formed between the control end and the output end of the first transistor Tr1. The first transistor may include an output end that is connected with the gate voltage output end OUT. The output end of the first transistor Tr1 may also be connected with the noise remover 515 and the pull-down unit 516. The output end of the first transistor Tr1 may also be connected with the first voltage input end Vin1 supplying the first low voltage VSS1 through the noise remover 515 and the pull-down unit 516. As a result, a voltage value of the gate-off voltage has a value of the first low voltage VSS1.

The output unit 514 may output a gate voltage according to a voltage of the node Q and the first clock signal CKV. A voltage difference occurs between the output end and the control end of the first transistor Tr1 due to the voltage of the node Q. When the high voltage is applied by the clock signal after the voltage difference is stored in the first capacitor C1, the charged voltage is boosted up such that a high voltage is output as a gate-on voltage.

The noise remover 515 may be a portion controlled by an output of the node I. The noise remover 515 may include five transistors (i.e., a third transistor Tr3, a tenth transistor Tr10, a (10-1)-th transistor Tr10-1, an eleventh transistor Tr11, and a (11-1)-th transistor Tr11-1. A control end of the third transistor Tr3 may be connected with the node I. The third transistor Tr3 may include an input end that is connected with the gate voltage output end OUT, and an output end that is connected with the first voltage input end Vin1 supplying the first low voltage VSS2. The third transistor Tr3 changes a voltage of the gate voltage output end OUT to the first low voltage VSS1 according to the voltage of the node I. The tenth transistor Tr10 and the (10-1)-th transistor Tr10-1 may be a pair of transistors. The tenth transistor Tr10 may have an output end that is connected to the input end of the (10-1) transistor Tr10-1. The control ends of the tenth transistor TR10 and the (10-1)-th transistor Tr10-1 may be connected to the node I as the same end (hereinafter, "an additional connection"). The input end of the 10th transistor Tr10 may be connected to the node Q and output end of the (10-1) transistor may be connected with the second voltage input end Vin2 supplying the second low voltage VSS2. The tenth transistor Tr10 and the (10-1)-th transistor Tr10-1 change the voltage of the node Q to the second low voltage VSS2 according to the voltage of the node I. When a pair of additionally connected transistors are used, the two transistors receive the same voltages divided from a voltage difference between the second low voltage and the voltage of the node I such that a leakage current is insignificantly generated in the node Q. According to exemplary embodiments, the tenth and (10-1)-th transistors Tr10 and Tr10-1 may be formed with a structure in which three or more transistors are additionally connected. In case of the additionally formed transistors, input ends and output ends may be connected to each other, and control ends may be connected to the same node I. A control end of the eleventh transistor Tr11 may be connected with the node I. The eleventh transistor TR11 may include an input end that is connected with the transmission signal output end CRout and an output end that is connected with the second voltage input end Vin2 supplying the second low voltage VSS2. The eleventh transistor Tr11 changes a voltage of the transmission signal output end CRout to the second low voltage VSS2 according to the voltage of the node I. A control end of the (11-1)-th transistor Tr11-1 may be connected with the node I of the previous stage through the third input end IN3. The (11-1)-th transistor Tr11-1 may include an input end that is connected with the gate voltage output end OUT and an output end that is connected with the first voltage input end Vin1. The (11-1)-th transistor Tr11-1 may change a voltage of the gate voltage output end OUT to the first low voltage VSS1 according to the voltage of the node I (i.e., an output of the inverter) of the previous stage. Here, the third transistor Tr3 may change a voltage of the gate voltage output end OUT to the first low voltage VSS1 by the inverter output of the current stage. The (11-1)-th transistor Tr11-1 may change a voltage of the gate voltage output end OUT to the first low voltage VSS1 by the inverter output of the previous stage.

As a portion controlled by the transmission signal CR of the next stage, the pull-down unit 516 may include four transistors (i.e., a second transistor Tr2, a ninth transistor Tr9, a (9-1)-th transistor Tr9-1, and a seventeenth transistor Tr17). A control end of the second transistor Tr2 may be connected to the second input end IN2. The second transistor Tr2 may include an input end that is connected with the gate voltage output end OUT and an output end that is connected with the first voltage input end Vin1 supplying the first low voltage VSS1. The second transistor Tr2 changes a voltage of the gate voltage output end OUT to the first low voltage VSS1 according to the transmission signal CR of the next stage. The ninth and (9-1)-th transistors Tr9 and Tr9-1 may be a pair of transistors. The ninth transistor Tr9 may include an output end that is connected to the input end of the (9-1)-th transistor Tr9-1. The ninth and (9-1)-th transistors Tr9 and Tr9-1 may be a pair of additionally connected transistors. The input end of the ninth transistor Tr9 may be connected to the node Q and output end of the (9-1)th transistor may be connected with the second voltage input end Vin2 supplying the second low voltage VSS2. As described, when a pair of additionally connected transistors are used, the two transistors may receive the same voltages divided from a voltage difference between the second low voltage and a carry signal of the next stage (particularly a voltage of the low voltage) such that a leakage current is insignificantly generated in the node Q. According to an exemplary embodiment, the ninth and (9-1)-th transistors Tr9 and Tr9-1 may be formed with a structure in which three or more transistors are additionally connected. In case of the additionally formed transistors, input ends and output ends may be connected to each other and control ends may be connected to the same second input end IN2. A control end of the seventeenth transistor Tr17 may be connected to the second input end IN2. The seventeenth transistor Tr17 may be include an input end connected with the transmission signal output end CRout and an output end that is connected with the second voltage input end Vin2 supplying the second low voltage VSS2.

The gate voltage and the transmission signal CR may have various voltage values. However, in the present exemplary embodiment, the gate-on voltage is 25 V, the gate-off voltage and the first low voltage VSS1 are −5 V, a high voltage of the transmission signal CR is 25 V, and a low voltage and the second low voltage VSS2 are −10 V. Hereinafter, the operation will be described based on the above-stated voltage levels.

When the transmission signal generator 513 and the output unit 514 operate by the voltage of the node Q, one stage SR may output a high voltage of the transmission signal CR and the gate-on voltage. The transmission signal CR is lowered to the second low voltage VSS2 from the high voltage by the transmission signals CR of the previous stage and the next stage and the gate-on voltage becomes a gate-off voltage.

In general, a leakage current generated in a thin film transistor using an oxide semiconductor is 10 times a leakage current generated in a thin film transistor using amorphous silicon. When the leakage current is generated, a driving characteristic of the thin film transistor is deteriorated and power consumption is increased. Thus, generation of the leakage current in the thin film transistor using the oxide semiconductor should be prevented.

When the voltage difference generated between the control end and the output end of the first transistor Tr1 is stored in the capacitor C1, a high-level clock signal is applied to the input end of the first transistor Tr1. As a result, the voltage charged in the capacitor C1 is boosted up by coupling. When the voltage of the node Q is increased by the boost up, a voltage difference Vds between a source and a drain of the fourth transistor Tr4 and a voltage difference Vgs between a source and a gate of the fourth transistor Tr4 are also increased because they are connected to the node Q. A leakage current of the node Q is generated as the voltage difference Vds between the source and the drain and the voltage difference Vgs between the source and the gate are increased.

According to the exemplary embodiment, because the second low voltage VSS2 having a negative voltage value is applied to the second control end of the fourth transistor Tr4, a leakage current of the fourth transistor Tr4 is suppressed. In an alternate embodiment, the first low voltage VSS1 may be applied to the second control end of the fourth transistor Tr4.

In addition, as a turn-on time of the fourth transistor Tr4 is accumulated, a current flowing through the fourth transistor Tr4 is reduced when the fourth transistor Tr4 is turned on. According to the exemplary embodiment, the second low voltage VSS2 having a negative voltage value is applied to the second control end of the fourth transistor Tr4. Therefore, the decrease of current flowing through the fourth transistor Tr4 when the fourth transistor Tr4 can be suppressed.

An effect of the above-stated exemplary embodiment will be described with reference to FIGS. 10, 11, and 12.

Further, the fourth transistor Tr4 will be described in detail with reference to FIGS. 4, 5, 6, 7, 8, and 9.

Figure 4:
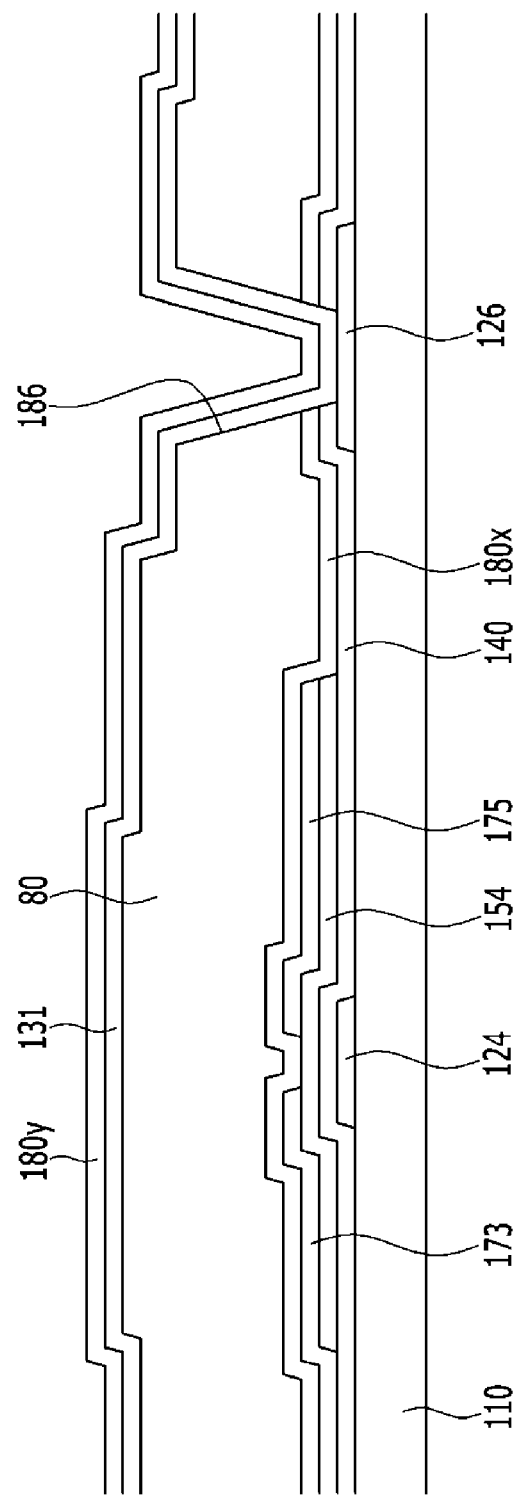
FIG. 4 is a cross-sectional view of a thin film transistor included in a stage according to the exemplary embodiment.

FIG. 4 is a cross-sectional view of a thin film transistor included in a stage according to the exemplary embodiment.

The thin film transistor of the exemplary embodiment includes a gate electrode 124 and a voltage wire 126 formed on an insulation substrate 110 made of a material such as glass or plastic.

The gate electrode 124 and the voltage wire 126 may include a low resistance metal material. Although it is not illustrated, a wire connected with the gate electrode 124 may be formed. In addition, a signal applied to the first input end IN1 may be applied to the gate electrode 124. Further, the first low voltage VSS1 or the second low voltage VSS2 may be applied through the voltage wire 126.

A gate insulating layer 140 may be formed on the gate electrode 124 and the voltage wire 126. The gate insulating layer 140 may include an inorganic insulating material such as a silicon nitride ($SiN_x$) and a silicon oxide ($SiO_x$). The gate insulating layer 140 may partially exposes the voltage wire 126.

A semiconductor pattern 154 may be formed on the gate insulating layer 140. The semiconductor pattern 154 may overlap the gate electrode 124. The semiconductor pattern 154 may include an oxide semiconductor material. For example, the semiconductor pattern 154 may include indium gallium zinc oxide (IGZO), zinc tin oxide (ZTO), indium tin oxide (IZO). Any other suitable materials may be used for the semiconductor pattern 154.

A source electrode 173 and a drain electrode 175 may be formed on the semiconductor pattern 154. The source electrode 173 and the drain electrode 175 may be separated from each other. The source electrode 173 and the drain electrode 175 may include a low resistance metal material. For example, the source electrode 173 and the drain electrode 175 may include at least one of copper (Cu), aluminum (Al), silver (Ag), molybdenum (Mo), chromium (Cr), gold (Au), platinum (Pt), palladium (Pd), tantalum (Ta), tungsten (W), titanium (Ti), nickel (Ni), and alloys of the listed metals. Further, the source electrode 173 and the drain electrode 175 may be formed of a single layer or a multilayer. More specifically, the source electrode 173 and the drain electrode 175 may be formed of a double layer, or a triple layer, made of different materials. The source electrode 173 and the drain electrode 175 may include any number of layers.

A first passivation layer 180x may be formed on the source electrode 173, the drain electrode 175, and the gate insulating layer 140. The first passivation layer 180x may include an inorganic insulator such as a silicon nitride (SiNx) or a silicon oxide (SiOx).

An organic insulator 80 may be provided on a part of the first passivation layer 180x. The organic insulator 80 may substantially have a flat surface. The organic insulator 80 may include a contact hole 186. The organic insulator 80 may be removed in an area corresponding to the voltage wire 126. Thus, the organic insulator 80 is not disposed in an area where the contact hole 186 is formed that exposes the voltage wire 126.

A first electrode 131 may be formed on the organic insulator 80. The first electrode 131 may be made of a transparent conductive material such as ITO or IZO.

The first electrode 131 may be connected with the voltage wire 126 disposed in a peripheral area of a display area through the contact hole 186. Thus, the first electrode 131 may receive the first low voltage VSS1 or the second low voltage VSS2. The first electrode 131 may extend upward from the gate electrode 124 and may be formed in an area overlapping the gate electrode 124.

A second passivation layer 180y may be formed on the first electrode 131. The second passivation layer 180y may include an inorganic insulator such as a silicon nitride ($SiN_x$) or a silicon oxide ($SiO_x$).

As previously described, the first electrode 131 connected with the voltage wire 126 that receives the low voltage VSS1 or VSS2 may be formed above the gate electrode 124 of the thin film transistor. Thus, the first electrode 131 may include a top gate electrode of the thin film transistor, including the gate electrode 124, the semiconductor pattern 154, the source electrode 173, and the drain electrode 175.

Referring to FIGS. 5, 6, 7, and 8, a method for forming a thin film transistor array panel according to an exemplary embodiment will be described.

FIGS. 5, 6, 7, and 8 are process cross-sectional views of a manufacturing method of the thin film transistor according to the exemplary embodiment of FIG. 4.

Figure 5:
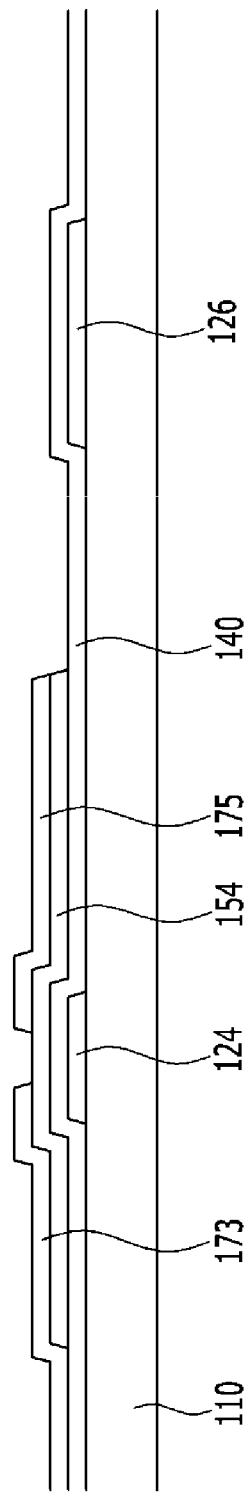
FIGS. 5, 6, 7, and 8 are process cross-sectional views of a manufacturing method of the thin film transistor according to the exemplary embodiment of FIG. 4.

As shown in FIG. 5, the gate electrode 124 and the voltage wire 126 may be formed using a low resistance metal material on the insulation substrate 110. The insulation substrate 110 may include glass or plastic.

Next, the gate insulating layer 140 may be formed using an inorganic insulating material such as a silicon nitride ($SiN_x$) and a silicon oxide ($SiO_x$) on the gate electrode 124 and the voltage wire 126.

Next, a semiconductor material layer may be formed using an oxide semiconductor material such as indium gallium zinc oxide (IGZO), zinc tin oxide (ZTO), indium tin oxide (IZO) on the gate insulating layer 140. A metal material layer may be formed using a low resistance metal material on the semiconductor material layer. The metal material layer and the semiconductor material layer may be etched such that a semiconductor pattern 154 is formed.

Next, the metal material layer may be etched to form the source electrode 173 and the drain electrode 175. The source electrode 173 and the drain electrode 175 may be formed to be separated from each other at lateral ends of the gate electrode 124.

Figure 6:
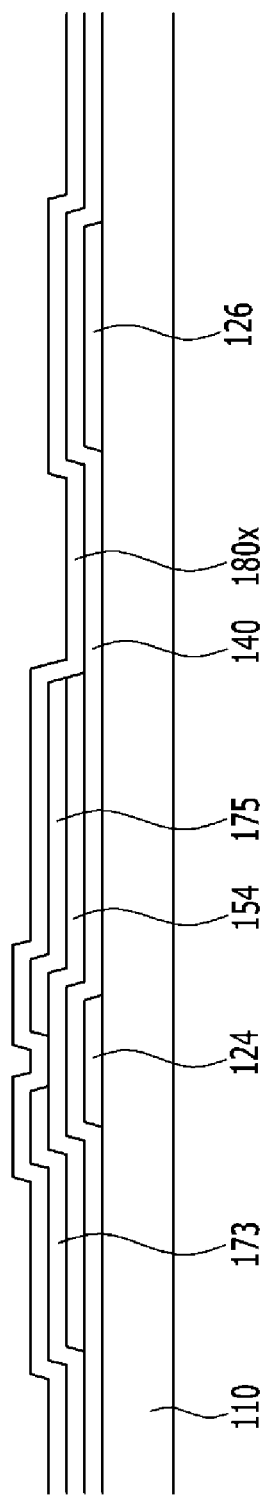

As shown in FIG. 6, the first passivation layer 180x may be layered on the source electrode 173, the drain electrode 175, and the gate insulating layer 140. The first passivation layer 180x may include an inorganic insulator such as a silicon nitride ($SiN_x$) or a silicon oxide ($SiO_x$).

Figure 7:
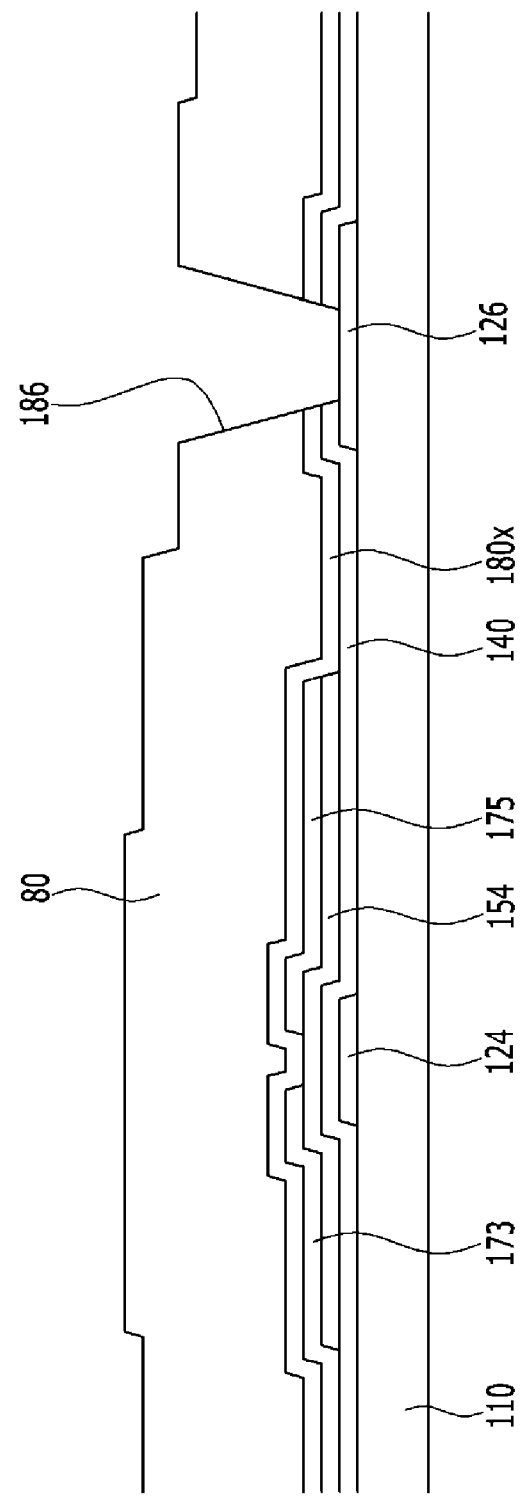

As shown in FIG. 7, the organic insulator 80 may be formed. The organic insulator 80 may be form with the contact hole 186 in a location that corresponds to the voltage wire 126 is formed on a part of the first passivation layer 180x. The organic insulator 80 may include an organic material. The organic insulator 80 may be substantially flat. The organic insulator 80 may be a color filter. If the organic insulator 80 is a color filter, a capping layer may be further formed on the organic insulator 80. The contact hole 186 may be formed to partially expose the voltage wire 126 after forming the gate insulating layer 140, the first passivation layer 180x, and the organic insulator 80.

Figure 8:
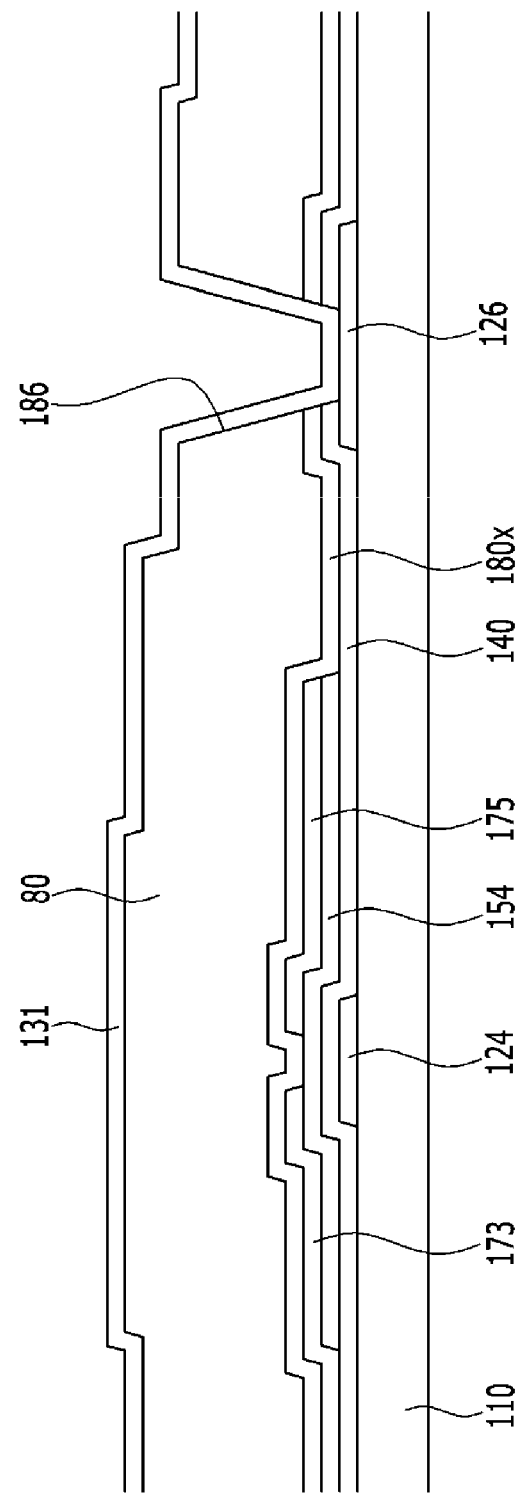

As shown in FIG. 8, the first electrode 131 may be formed on the organic insulator 80 to contact the voltage wire 126 through the contact hole 186 and to extend upward from the gate electrode 124.

Figure 9:
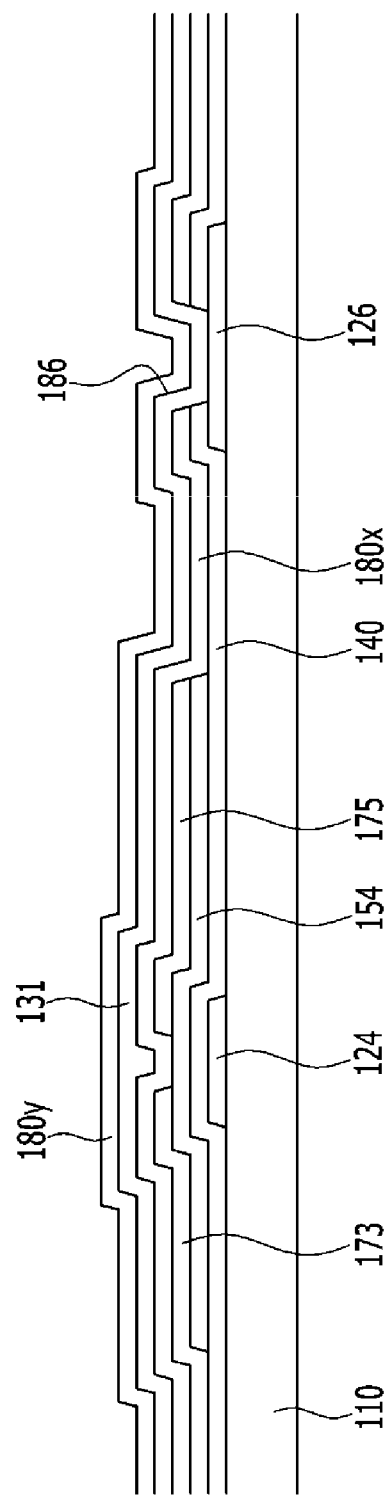
FIG. 9 is a cross-sectional view of a thin film transistor included in a stage according to another exemplary embodiment.

FIG. 9 is a cross-sectional view of a thin film transistor included in a stage according to another exemplary embodiment.

As shown in the drawing, unlike the thin film transistor of FIG. 4, an organic insulator 80 is omitted in a thin film transistor of the exemplary embodiment of FIG. 9. A process for forming the organic insulator 80 after layering of the first passivation layer 180x, described in FIG. 6, is omitted. As shown in FIG. 9, a contact hole 186 that partially exposes a voltage wire 126 may be formed in a gate insulating layer 140 and a first passivation layer 180x. The first electrode 131 may be formed on the first passivation layer 180x to contact the voltage wire 126 through the contact hole 186 such that the thin film transistor can be manufactured.

Next, a magnitude of a current flowing when a thin film transistor included in a thin film transistor array panel is turned on will be described with reference to FIG. 10, FIG. 11, and FIG. 12.

Figure 10:
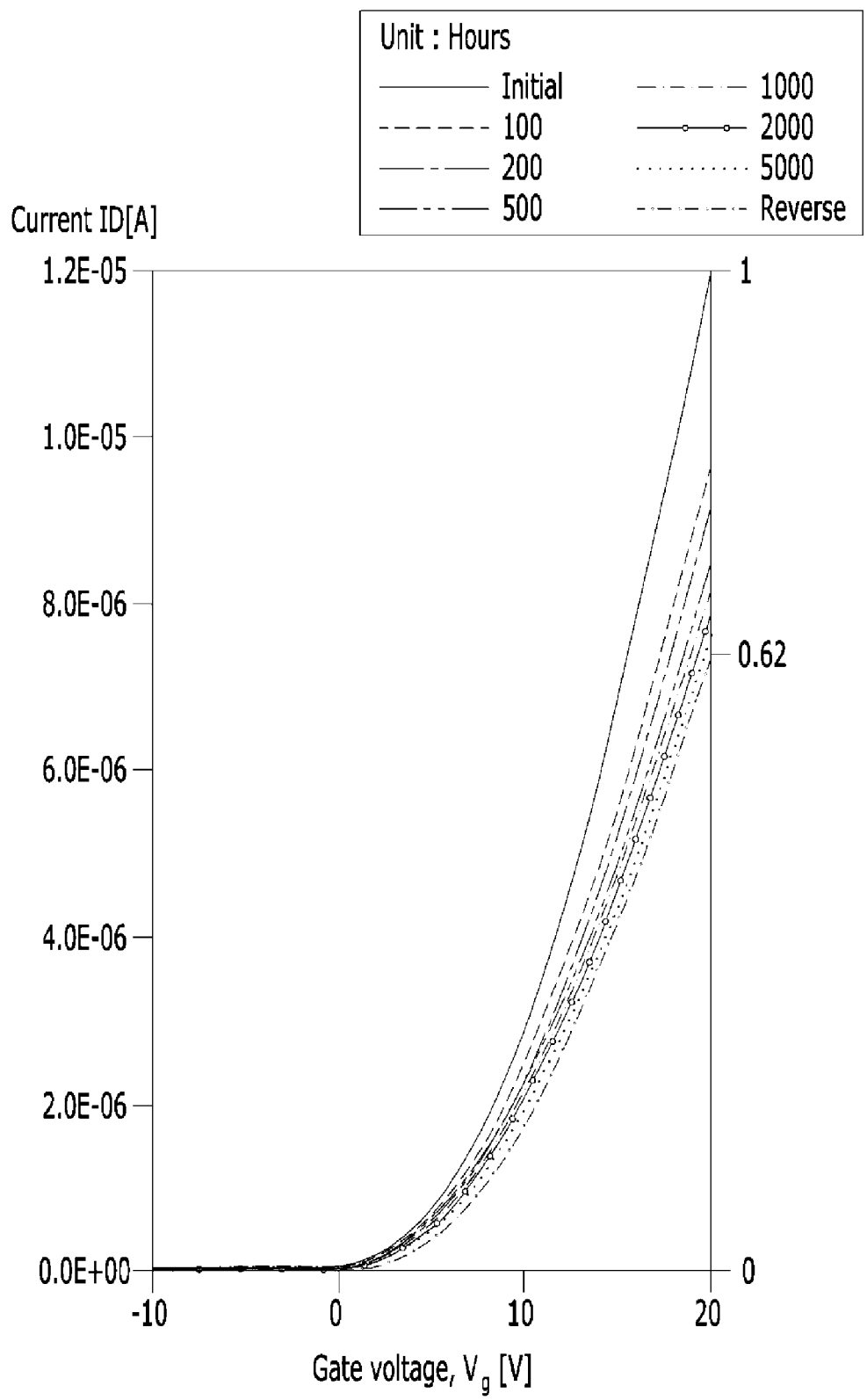
FIGS. 10 and 11 are graphs illustrating current determined according to a voltage applied to a first electrode of the thin film transistors according to the exemplary embodiments.
Figure 11:
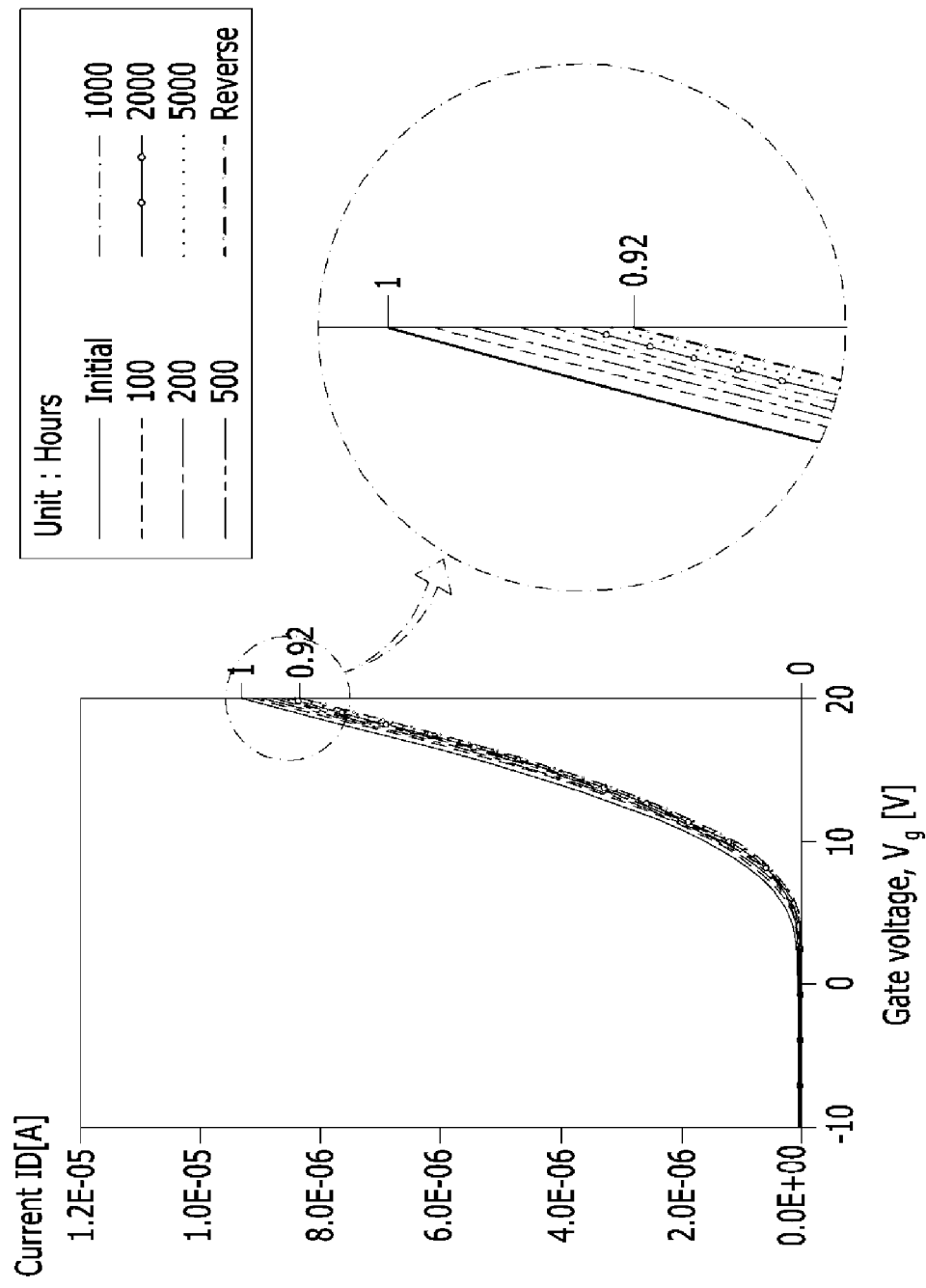

FIGS. 10 and 11 are graphs illustrating current values according to a voltage applied to the first electrode 131 of the thin film transistor according to the exemplary embodiment with respect to time. FIG. 12 is a graph illustrating current having varying voltage determined according to a voltage applied to a first electrode of a thin film transistor according to an exemplary embodiment.

First, as shown in FIG. 10, a voltage of 0 V is applied to the first electrode 131, a voltage of 20 V is applied to the gate electrode 124, and voltages having a predetermined voltage difference are respectively applied to lateral ends of the source electrode 173 and the drain electrode 175 to measure a current flowing through the thin film transistor with respect to time. In this case, a voltage applied to the source electrode 173 is higher than a voltage applied to the drain electrode 175.

When a Current ID flowing through the thin film transistor has an initial value of 1, a Current ID flowing through the thin film transistor is reduced to be lower than 1 in the same state as time lapses (100, 200, . . . , 5000).

In addition, when the voltage applied to the source electrode 173 and the voltage applied to the drain electrode 175 are reversely applied and then a Current ID flowing through the thin film transistor is measured. The current ID flowing through the thin film transistor has a value of about 0.62.

In FIG. 11, when a voltage of −30 V is applied to the first electrode 131, a voltage of 20 V is applied to the gate electrode 124, and voltages having a predetermined voltage difference are respectively applied to lateral ends of the source electrode 173 and the drain electrode 175, a current flowing through the thin film transistor is measured with respect to time. In this case, a voltage applied to the source electrode 173 is higher than a voltage applied to the drain electrode 175.

When a Current ID flowing through the thin film transistor has an initial value of 1, a Current ID flowing through the thin film transistor is reduced to be lower than 1 in the same state as time lapses (100, 200, . . . , 5000).

In addition, when the voltage applied to the source electrode 173 and the voltage applied to the drain electrode 175 are reversely applied and then a Current ID flowing through the thin film transistor is measured, the Current ID flowing through the thin film transistor has a value of about 0.92.

Thus, in comparison between experimental values of FIGS. 10 and 11, when a negative voltage of −30 V is applied to the first electrode 131 according to the exemplary embodiment, a decrease of the Current ID that flows when the thin film transistor is turned on is suppressed.

Figure 12:
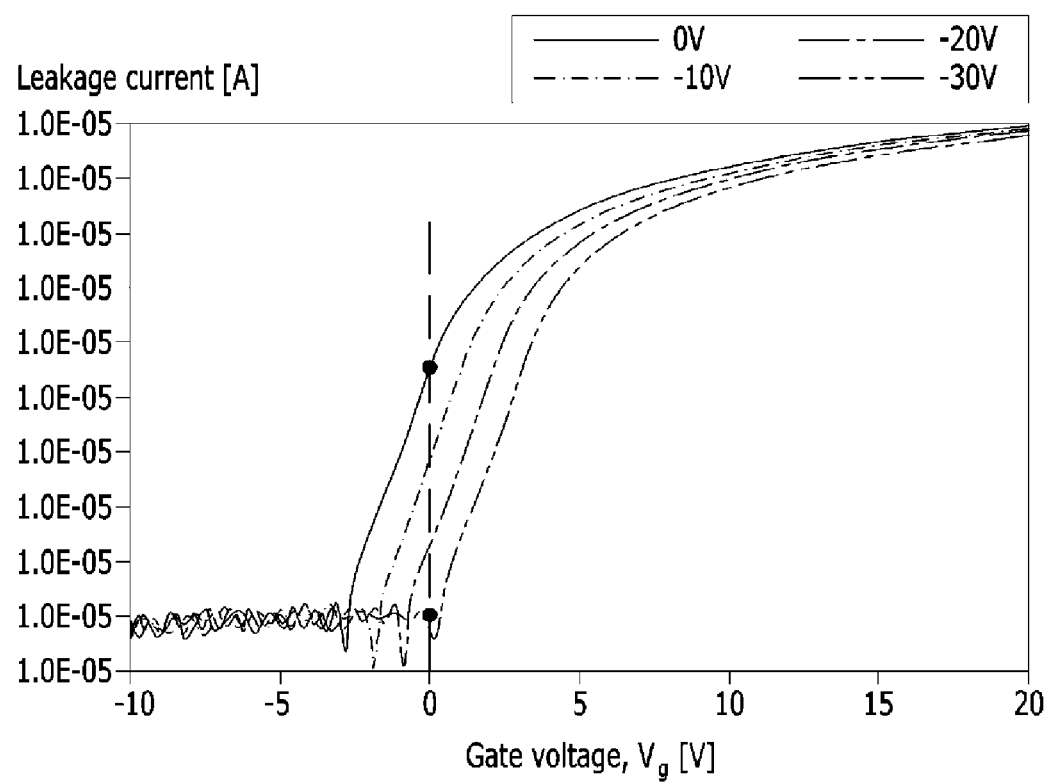
FIG. 12 is a graph illustrating current having varying voltage determined according to a voltage applied to a first electrode of a thin film transistor according to an exemplary embodiment.

Next, referring to FIG. 12, when a voltage applied to the gate electrode 124 is increased, a leakage current flowing through the thin film transistor is decreased as the voltage applied to the first electrode 131 is increased in a negative direction. As shown in the drawing, when a voltage of 0 V is applied to the gate electrode 124, a leakage current measured when a voltage applied to the first electrode 131 is 0 V is lower than a leakage current measured when the voltage applied to the first electrode 131 is −30 V. Accordingly, a leakage current flowing at lateral ends of the thin film transistor can be decreased according to an exemplary embodiment of the present inventive concept.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
a display area comprising a gate line and a data line; and
a gate driver connected to an end of the gate line, the gate driver comprising a stage integrated on a substrate and configured to output a gate voltage, wherein the stage comprises an input unit and an output unit,
wherein the output unit comprises a first transistor and a first capacitor,
wherein the first transistor comprises an input terminal configured to receive a clock signal, a control terminal connected to a node of the input unit, and an output terminal connected to a gate voltage output terminal configured to output the gate voltage,
wherein the input unit comprises a second transistor, and
wherein the second transistor comprises an input terminal and a first control terminal commonly connected to the input terminal of the second transistor, a second control terminal configured to receive a low voltage from a low voltage input, and an output terminal connected to the control terminal of the first transistor.

2. The display device of claim 1, wherein the low voltage from the low voltage input is less than the gate voltage output by the output unit.

3. The display device of claim 2, wherein the stage further comprises a pull-down unit comprising a first pair of transistors, wherein the first pair of transistors each comprises a control terminal configured to receive an output of a next stage, and
wherein the first pair of transistors comprise an input terminal connected to the node and an output terminal connected to the low voltage input.

4. The display device of claim 3, wherein the stage further comprises a transmission signal generator comprising a third transistor, and
wherein the third transistor comprises an input terminal configured to receive the clock signal, a control terminal connected to the node, and an output terminal connected to a transmission signal output terminal configured to output a transmission signal.

5. The display device of claim 4, wherein the stage further comprises an inverter unit comprising a fourth transistor and a sixth transistor connected to the low voltage input,
wherein an inverter voltage output from the inverter unit is less than the gate voltage output by the output unit.

6. The display device of claim 5, wherein the stage further comprises a noise removal unit comprising a second pair of transistors,
wherein the second pair of transistors each comprises a control terminal configured to receive an inverter voltage of the inverter unit, and
wherein the second pair of transistors comprises an input terminal connected to the node and an output terminal connected to the low voltage input.

7. The display device of claim 6, wherein the pull-down unit further comprises a fifth transistor comprising a control terminal configured to receive an output of a next stage, an input terminal connected to the transmission signal output terminal, and an output terminal connected to the low voltage input.

8. The display device of claim 7, wherein at least one of the transistors of the stage comprises an oxide semiconductor.

9. A display device, comprising:
a gate line; and
a gate driver connected to the gate line and comprising a stage configured to output a gate voltage to the gate line, wherein the stage comprises an input unit and an output unit,
wherein the output unit comprises a first transistor and a first capacitor,
wherein the first transistor comprises an input terminal configured to receive a clock signal, a control terminal connected to a node of the input unit, and an output terminal connected to a gate voltage output terminal configured to output the gate voltage,
wherein the input unit comprises a second transistor, and
wherein the second transistor comprises an input terminal and a first control terminal commonly connected to the input terminal of the second transistor, a second control terminal configured to receive a low voltage from a low voltage input, and an output terminal connected to the control terminal of the first transistor.

10. The display device of claim 9, wherein the low voltage from the low voltage input is less than the gate voltage output by the output unit.

11. The display device of claim 10, wherein the stage further comprises a pull-down unit comprising a first pair of transistors,
wherein the first pair of transistors each comprises a control terminal configured to receive an output of a next stage, and wherein the first pair of transistors comprise an input terminal connected to the node and an output terminal connected to the low voltage input.

12. The display device of claim 11, wherein the stage further comprises a transmission signal generator comprising a third transistor, and wherein the third transistor comprises an input terminal configured to receive the clock signal, a control terminal connected to the node, and an output terminal connected to a transmission signal output terminal configured to output a transmission signal.

13. The display device of claim 12, wherein the stage further comprises an inverter unit comprising a fourth transistor and a sixth transistor connected to the low voltage input, wherein an inverter voltage output from the inverter unit is less than the gate voltage output by the output unit.

14. The display device of claim 13, wherein the stage further comprises a noise removal unit comprising a second pair of transistors, wherein the second pair of transistors each comprise a control terminal configured to receive an inverter voltage of the inverter unit, and wherein the second pair of transistors comprise an input terminal connected to the node and an output terminal connected to the low voltage input.

15. The display device of claim 14, wherein the pull-down unit further comprises a fifth transistor comprising a control terminal configured to receive an output of a next stage of the gate driver, an input terminal connected to the transmission signal output terminal, and an output terminal connected to the low voltage input.

16. The display device of claim 15, wherein at least one of the transistors of the stage comprises an oxide semiconductor.

* * * * *